United States Patent [19]
Sexton et al.

[11] Patent Number: 5,225,371
[45] Date of Patent: Jul. 6, 1993

[54] LASER FORMATION OF GRADED JUNCTION DEVICES

[75] Inventors: Douglas A. Sexton; Stephen D. Russell, both of San Diego, Calif.

[73] Assignee: The United States of America as represented by the Secretary of the Navy, Washington, D.C.

[21] Appl. No.: 856,010

[22] Filed: Mar. 17, 1992

[51] Int. Cl.$^5$ .......................................... H01L 21/268
[52] U.S. Cl. .................................. 437/173; 437/174
[58] Field of Search ............................. 437/173, 174

[56] References Cited

U.S. PATENT DOCUMENTS

| | | |
|---|---|---|
| 3,940,289 | 2/1976 | Marquardt et al. |
| 4,203,781 | 5/1980 | Miller. |
| 4,343,832 | 8/1982 | Smith et al. |
| 4,364,778 | 12/1982 | Leamy et al. |
| 4,407,060 | 10/1983 | Sakurai. |
| 4,771,010 | 9/1988 | Epler et al. |
| 5,114,876 | 5/1992 | Weiner ................... 437/173 |

FOREIGN PATENT DOCUMENTS 168021  7/1988  Japan ................... 437/173

OTHER PUBLICATIONS

G. L. Patton et al "Silicon–Germanium–base Heterojunction Bipolar Transistors by Molecular Beam Epitaxy" IEEE Electron Dev. Lett. vol. 9, pp. 165–167 (Apr. 1988).
H. Kroemer "Two Integral Relations Returning to the Electron Transport through a Bipolar Transistors with a Nonuniform Energy Gap in the Base Region" Solid State Electron, vol. 28, pp. 1101–1103 (Nov. 1985).
C. A. King et al "Si Si6e Heterojunction Bipolar Transistors Produced by Limited Reaction Processing" IEEE Electron Dev. Lett. vol. 10 (Feb. 1989) pp. 52–54.
J. D. Cressler et al., "Sub-30ps ECL Circuit Operation at Liquid Nitrogen Temperature Using Self-aligned Epitaxial Side-base Bipolar Transistors" IEEE Electron Device Lett., vol. 12, pp. 166–168, (Apr. 1991).
J. R. Abelson, et al, "Epitaxial $Ge_x Si_{1-x}$/Si (100) Structures Produced by Pulsed Laser Mixing of Evaporated Ge on Si(100) Substrates" Appl. Phys. Lett. vol. 52, pp. 230–231 Jan. 1988.
G. L. Patton et al. "75 Ghz $f_t$SiGe-Base Heterojunction Bipolar Transistors" IEEE Electron Dev. Lett. vol. 11 (Apr. 1990) pp. 171–173.
K. H. Weiner et al "Emitter and base fabrication in advanced bipolar transistors using gas immersion laser doping" Proceedings of the 1988 Bipolar Circuits and Technology Meeting, IEEE (1988) (abs).
T. Tatsumi et al "Si/$Ge_3Si_{.7}$/Si Heterojunction Bipolar Transistor Made with Si Molecular Beam Epitaxy" Appl. Phys. Lett. vol. 52 pp. 895–896 (Mar. 1988).
G. L. Patton et al "Graded-SiGe-base, Poly-emitter Heterojunction Bipolar Transistors" IEEE Electron Dev. Lett. vol. 10 pp. 534–536 (Dec. 1989).

Primary Examiner—Tom Thomas
Assistant Examiner—Linda J. Fleck
Attorney, Agent, or Firm—Harvey Fendelman; Thomas Glenn Keough

[57] ABSTRACT

A method for fabricating graded heterojunction electronic devices uses laser melting and recrystallization of layered films to create an epitaxial alloy heterojunction. Layering an appropriately doped polysilicon film over a germanium film that has been deposited upon a base region allows the laser melting and recrystallization thereof to create a graded epitaxial silicon/germanium alloy heterojunction. Other film materials could be selected for other graded heterojunctions. The method provides for sufficient device design flexibility including deeper junction formation and reduces the problems associated with contamination.

7 Claims, 1 Drawing Sheet

LASER FORMATION OF GRADED JUNCTION DEVICES

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Graded junctions are used in solid state transistors to enhance device performance. The application of a graded junction in the base region of a bipolar transistor results in the formation of a nonuniform energy gap. A graded bandgap can be employed to reduce base transit time and thus increase the device speed, see H. Kroemer's "Two Integral Relations Pertaining to the Electron Transport through a Bipolar Transistor with a Nonuniform Energy Gap in the Base Region", *Solid-State Electron*, Vol. 28, (November 1985), pp. 1101-1103. The bandgap of silicon can be varied by the introduction of dopants, the formation of alloys, e.g. silicon/germanium (SiGe), and/or the introduction of strain into the crystal lattice. Combinations of all three of these phenomena have been used to produce very high speed graded SiGe-base heterojunction bipolar transistors, such as reported in G. L. Patton et al's. "75-Ghz $f_t$ SiGe-Base Heterojunction Bipolar Transistors," *IEEE Electron Device Lett.*, Vol. 11 (April 1990), pp. 171-173, and "Graded-SiGe-base, Poly-emitter Heterojunction Bipolar Transistors, " *IEEE Electron Device Lett.*, Vol. 10 (December 1989), pp. 534-536). In addition, in accordance with J. D. Cressler et al's., "Sub-30-ps ECL Circuit Operation at Liquid Nitrogen Temperature Using Self-aligned Epitaxial SiGe-base Bipolar Transistors," *IEEE Electron Device Lett.*, Vol. 12 (April 1991), pp. 166-168, these devices have many advantages over conventional silicon devices for high speed digital and microwave devices by providing higher emitter injection efficiency, lower base resistance, lower base transit times, and superior low temperature speed and gain.

The SiGe alloys employed in the devices are epitaxially grown onto single crystal (100) silicon and have crystal lattices which assume the smaller Si lattice spacing. The resulting strain makes an important contribution to the bandgap reduction in the commensurately grown alloy material. As discussed above, this material is used as the base region of these transistors. The alloys must be formed at temperatures below those conventionally used for epitaxial growth (above 900° C.) and subsequent processing must also remain at temperatures below about 850° C. to avoid strain relaxation through the formation of misfit dislocations at the alloy/silicon interface.

Limited reaction processing (LRP), ultrahigh-vacuum/chemical vapor deposition (UHV/CVD), and molecular beam epitaxy (MBE) have been used to produce strained heterojunction bipolar transistors. Further insight into these techniques, in addition to those referred to above is disclosed in C. A. King et al's., "Si/SiGe Heterojunction Bipolar Transistors Produced by Limited Reaction Processing," *IEEE Electron Device Lett.*, Vol. 10 (February 1989); G. L. Patton et al's., "Silicon-Germanium-base Heterojunction Bipolar Transistors by Molecular Beam Epitaxy," *IEEE Electron Device Lett.*, Vol. 9 (April 1988), pp. 165-167; and T. Tatsumi et al's "Si/Ge$_{0.3}$Si$_{0.7}$/Si Heterojunction Bipolar Transistor Made with Si Molecular Beam Epitaxy," *Appl. Phys. Lett.*, Vol. 52 (March 1988), pp. 895-896.

Thus, a continuing need exists for a method of fabricating a graded junction device relying on a pulsed laser rapidly melting of the layers of an amorphous or polycrystalline film of doped silicon over an amorphous or polycrystalline film of germanium and on a subsequent epitaxial recrystallizing to form an epitaxial silicon-germanium alloy with a graded heterojunction.

SUMMARY OF THE INVENTION

The present invention is directed to providing a method for fabricating an epitaxial alloy heterojunction device using a pulsed laser to melt an amorphous or polycrystalline film of germanium deposited on a base region and overlying dopant implanted film of amorphous or polycrystalline silicon and subsequent recrystallization thereof to create an epitaxial graded germanium/silicon heterojunction alloy layer. Other film dopant and underlying constituents can be chosen to fabricate other graded heterojunction alloy layers in accordance with this inventive concept.

An object of the device is to use a laser to effect a pulsed laser melting of polysilicon/germanium films on a silicon base to effect an epitaxial alloy with a graded heterojunction.

Another object is to provide a method for fabricating graded junction electronic devices using laser melting techniques and recrystallization.

Another object is to provide a method for creating graded heterojunctions relying on simple and highly controllable deposition and doping methods to produce contiguous, juxtaposed films to be melted by a laser and recrystallized.

Yet another object is to provide a method for fabricating a graded heterojunction having less susceptibility to contamination than contemporary techniques.

Still another object is to provide a method for creating a graded heterojunction allowing the depositing, doping, patterning and melting of a variety of epitaxial alloy configurations.

Still another object is to provide a method of fabricating a graded heterojunction using a laser that avoids deep melts, ablation or surface roughness.

Still another object is to provide a method for creating a heterojunction which allows deeper junction formation by the inclusion of an exposed polysilicon layer.

Another object is to provide a method of making a graded heterojunction using a polysilicon over-film to change the reflectivity of an underlying deposited film.

Still another object is to provide a method of fabricating a graded heterojunction made up of a deposited polysilicon film on top of a germanium film on a silicon surface.

These and other objects of the invention will become more readily apparent from the ensuing specification when taken in conjunction with the drawings and appended claims.

DESCRIPTION OF THE PREFERRED EMBODIMENT

Figure 1:
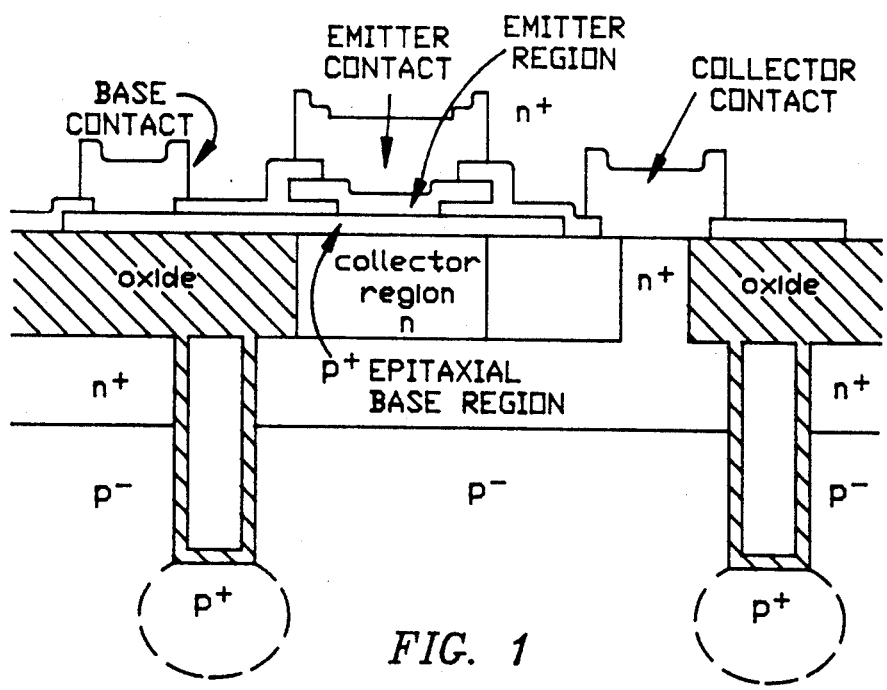
FIG. 1 depicts a typical vertical heterojunction bipolar transistor.
Figure 2:
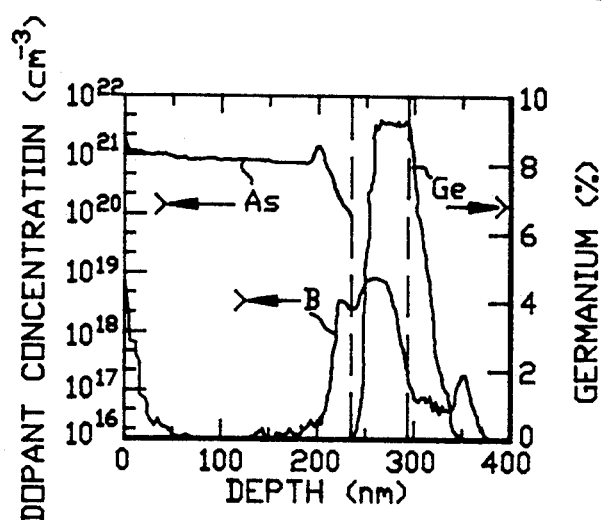
FIG. 2 shows the compositional profile of an npn graded SiGe-base heterojunction bipolar transistor as shown in FIG. 1.

A typical vertical heterojunction bipolar transistor is depicted in FIG. 1. The compositional profile of an npn graded SiGe-base heterojunction bipolar transistor is shown in FIG. 2. This desired base profile can be generated using laser melting techniques and recrystallization in accordance with this inventive concept.

Thin SiGe epitaxial films have been generated by evaporation of Ge onto a Si (100) silicon surface and subsequent melting of the substrate with a pulsed laser, see J. R. Abelson et al., "Epitaxial $Ge_xSi_{1-x}$/Si (100) Structures Produced by Pulsed Laser Mixing of Evaporated Ge on Si (100) Substrates," *Appl. Phys. Lett.*, Vol. 52 (January 1988), pp. 230-231. The process entails the rapid melting of the Ge and underlying Si to form a molten layer anywhere from 100 to 4000 Angstroms depending on the laser energy, laser pulse duration, and other factors such as sample reflectivity. The Ge diffuses into the silicon and rapidly recrystallizes in approximately 20 to 150 nanoseconds. If the strain in the newly formed layer is sufficiently low the alloy film will grow epitaxially onto the underlying Si (100) surface. As the source of the Ge is on the surface, the peak concentration will be at or near the surface. As the number of melt cycles is increased at the same absorbed fluence, the Ge concentration profile will flatten out.

The fabrication sequence for a vertical bipolar transistor, such as shown in FIG. 1, entails the formation of the base on top of the buried collector. The Ge concentration should peak at the collector base interface and the p-type dopant (in this example) should peak at the opposite interface (the eventual base-emitter interface). However, the process described in the preceding paragraph produces a profile which peaks at the wrong interface and provides no simple way of getting the p-type dopant into the base with the correct profile.

In accordance with this inventive concept, the germanium, Ge, for the base region is deposited via evaporation or alternatively by ion implantation, chemical vapor deposition, etc. in an amorphous or polycrystalline film onto the base region. The base region in this embodiment may be silicon although other materials may be selected with appropriate modification of the deposited films to account for compatibility of purpose.

A polysilicon film then is deposited on the Ge film and doped, for example, a suitable p-type dopant, such as boron, is implanted. The dopant now resides near the exposed surface of the polysilicon film and the Ge film is buried beneath the polysilicon film. Deposited film thicknesses will vary with the desired base widths and alloy concentrations. For a 750 Å thick base with about 10% Ge content, 75 Å of Ge would be deposited followed by 650 Å of polysilicon.

A pulsed laser irradiates the layered films in the base region at the proper intensity to effect a pulsed laser melting of the films. The Ge diffuses away from the base/collector interface region and towards the exposed surface of the dopant implanted polysilicon film surface. The p-type dopant, for example, boron diffuses from the surface of the base region, toward the back base/collector interface. Typically, a single pulse of laser fluence of about 1 joule/cm² is radiated over an entire die (about 1 cm²) to produce a melt depth of about 700-Å. After melting, the heat dissipates and the film recrystallizes epitaxially to form the desired compositional profile.

Figure 3:
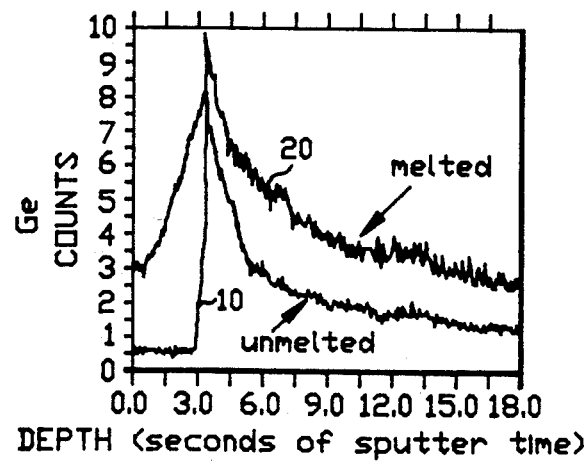
FIG. 3 shows a secondary ion mass spectrometer profile of the laser fabricated graded junction in accordance with this inventive concept.

FIG. 3 is a secondary ion mass spectrometer (SIMS) profile of the laser fabricated graded junction and shows the original polysilicon/Ge/Crystalline-silicon sample before 10 and after 20 the laser melting process. The Ge concentration is graded to increase below the surface as discussed above. The concentration tail at deeper depths is an artifact of the SIMS sputtering technique. The number of pulses and starting compositions can be varied to tailor the resultant profile to that which is desired.

This inventive concept of using a pulsed laser melting technique as described herein offers several advantages over both conventional and previous laser approaches. The laser process of this inventive concept uses simple and highly controllable deposition and doping methods to produce the layered film substrate to be melted. In MBE, LRP, and UHV/CVD techniques the critical base-collector junction is formed by the deposition process, making it susceptible to contamination. In contradistinction, this laser process forms the interface with the melt front, which reduces the likelihood of contamination at the junction.

In accordance with this inventive concept, the deposition of polysilicon film on top of the Ge film yields the desired graded profiles. The material of the films can be deposited, doped, patterned and then melted as desired. Since the Ge melting points and ablation thresholds are lower than silicon, when an attempt is made to obtain deep melts with a Ge film alone, ablation and/or surface roughness often results. This problem is reduced with this new method since it adds significant device design flexibility by allowing deeper junction formation than without the polysilicon layer. The reflectivity of the Ge is also different from Si which changes the absorbed energy as the alloy is being formed at the surface. This latter problem is also reduced by using a polysilicon over layer as practiced herein.

As will be apparent to one skilled in this art, alternative deposition techniques could be used to deposit the germanium, silicon, and dopants. The constituencies and dopants of the films can be varied to effect graded heterojunction devices that are compatible with other base region materials so long as the laser process has the appropriately doped polysilicon film overlying the other selected film to effect the desired profile. In addition to SiGe alloys, other alloys could be used to create a laser created graded heterojunction such as SiC. This is only suggested as an example and is not to be construed as limiting for other heterojunction device applications.

Obviously, many modifications and variations of the present invention are possible in the light of the above teachings. It is therefore to be understood that within the scope of the appended claims, the invention may be practiced otherwise than as specifically described.

We claim:

1. A method of fabricating a graded junction device comprising:
    providing a crystalline semiconductor region;
    providing layers of an amorphous film of doped silicon over an amorphous semiconductor film on said crystalline semiconductor region;
    rapidly melting said layers by a pulsed laser; and
    recrystallizing the melted layers to form an epitaxial graded alloy heterojunction.

2. A method of fabricating a graded junction device comprising:
   providing a crystalline semiconductor region;
   providing layers of an polycrystalline film of doped silicon over an polycrystalline semiconductor film on said crystalline semiconductor region;
   rapidly melting said layers by a pulsed laser; and
   recrystallizing the melted layers to form an epitaxial graded alloy heterojunction.

3. A method of fabricating a graded epitaxial silicon/germanium alloy heterojunction comprising:
   providing a collector region having a surface;
   applying an amorphous film of germanium on said surface of said collector region;
   applying an amorphous film of polysilicon on the amorphous germanium film;
   doping the amorphous polysilicon film with a suitable dopant;
   melting the amorphous germanium film and the doped polysilicon film with a pulsed laser;
   diffusing the germanium away from said collector region and the dopant toward said collector region by the melting thereof; and
   recrystallizing the germanium and polysilicon thereby forming an epitaxial graded silicon/germanium alloy heterojunction.

4. A method of fabricating a graded epitaxial silicon/germanium alloy heterojunction comprising:
   providing a collector region having a surface;
   applying a polycrystalline film of germanium on said surface of said collector region;
   applying a polycrystalline film of polysilicon on the germanium film;
   doping the polycrystalline polysilicon film with a suitable dopant;
   melting the polycrystalline germanium film and the doped polysilicon film with a pulsed laser;
   diffusing the polycrystalline germanium film away from said collector region and the dopant toward said collector region by the melting thereof;
   recrystallizing the germanium and polysilicon thereby forming an epitaxial graded silicon/germanium alloy heterojunction.

5. A method according to claim 1 or 2 in which the step of providing is the depositing of the films.

6. A method according to claim 3 or 4 in which the step of applying is the depositing of the films.

7. A method according to claim 3 or 4 in which the step of doping is the implanting of the dopant.

* * * * *